(12) United States Patent
Struble et al.

(10) Patent No.: US 7,532,066 B1
(45) Date of Patent: May 12, 2009

(54) BIAS NETWORK WITH STABLE TRANSIENT RESPONSE

(75) Inventors: Wayne M. Struble, Franklin, MA (US); Haoyang Yu, Nashua, NH (US)

(73) Assignee: TriQuinto Semiconductor, Inc., Hillsboro, OR (US)

( * ) Notice: Subject to any disclaimer, the term of this patent is extended or adjusted under 35 U.S.C. 154(b) by 87 days.

(21) Appl. No.: 11/837,060

(22) Filed: Aug. 10, 2007

(51) Int. Cl.
*H03F 1/14* (2006.01)
(52) U.S. Cl. .................... 330/51; 330/296; 330/288
(58) Field of Classification Search .......... 330/51, 330/296, 288
See application file for complete search history.

(56) References Cited

U.S. PATENT DOCUMENTS

| | | | |
|---|---|---|---|
| 6,744,321 B2 * | 6/2004 | Noh et al. | 330/296 |
| 6,803,822 B2 * | 10/2004 | Kim et al. | 330/296 |
| 6,873,211 B1 * | 3/2005 | Thompson et al. | 330/285 |
| 6,891,438 B2 * | 5/2005 | Arai et al. | 330/296 |
| 7,365,604 B2 * | 4/2008 | Luo et al. | 330/296 |
| 7,417,507 B2 * | 8/2008 | Yamamoto et al. | 330/296 |
| 2006/0119423 A1 | 6/2006 | Apel | |

* cited by examiner

*Primary Examiner*—Patricia Nguyen
(74) *Attorney, Agent, or Firm*—Schwabe, Williamson & Wyatt, P.C.

(57) ABSTRACT

Embodiments of apparatuses, articles, methods, and systems for a bias network providing a stable transient response are generally described herein. Other embodiments may be described and claimed.

26 Claims, 11 Drawing Sheets

US 7,532,066 B1

BIAS NETWORK WITH STABLE TRANSIENT RESPONSE

FIELD

Embodiments of the present invention relate generally to the field of circuits, and more particularly to a bias network providing a stable transient response.

BACKGROUND

A current mirror is a basic building block in the design of a direct current (DC) bias network, which may be used in a radio frequency (RF) power amplifier (PA). In some applications, e.g., a radio in a wireless local area network (WLAN), a PA is required to be pulsed on and off during operation at a relatively high frequency. This is accomplished by pulsing bias networks within the PA on and off.

As a bias network within the PA is pulsed on and off, the output conductance of a transistor within a current mirror of the bias network may vary as the voltage across the bias network ramps up and down. This results in a time-dependent bias network output voltage, which, in turn, results in a time-dependent bias current for a main transistor of the bias network. As the bias current varies over the bias network pulse, the RF gain of the PA's pulse may also vary. This results in time-dependent amplitude modulation (AM)—AM distortion and AM—pulse modulation (PM) distortion.

In order to simplify the communication systems, most demodulators only track amplitude at the beginning of a PA's pulse. Therefore, any change in the RF gain over the PA's pulse will degrade an error vector magnitude (EVM), which is used to measure a performance of a radio transceiver.

BRIEF DESCRIPTION OF THE DRAWINGS

Embodiments of the invention are illustrated by way of example and not by way of limitation in the figures of the accompanying drawings, in which like references indicate similar elements and in which.

DETAILED DESCRIPTION

Figure 1:
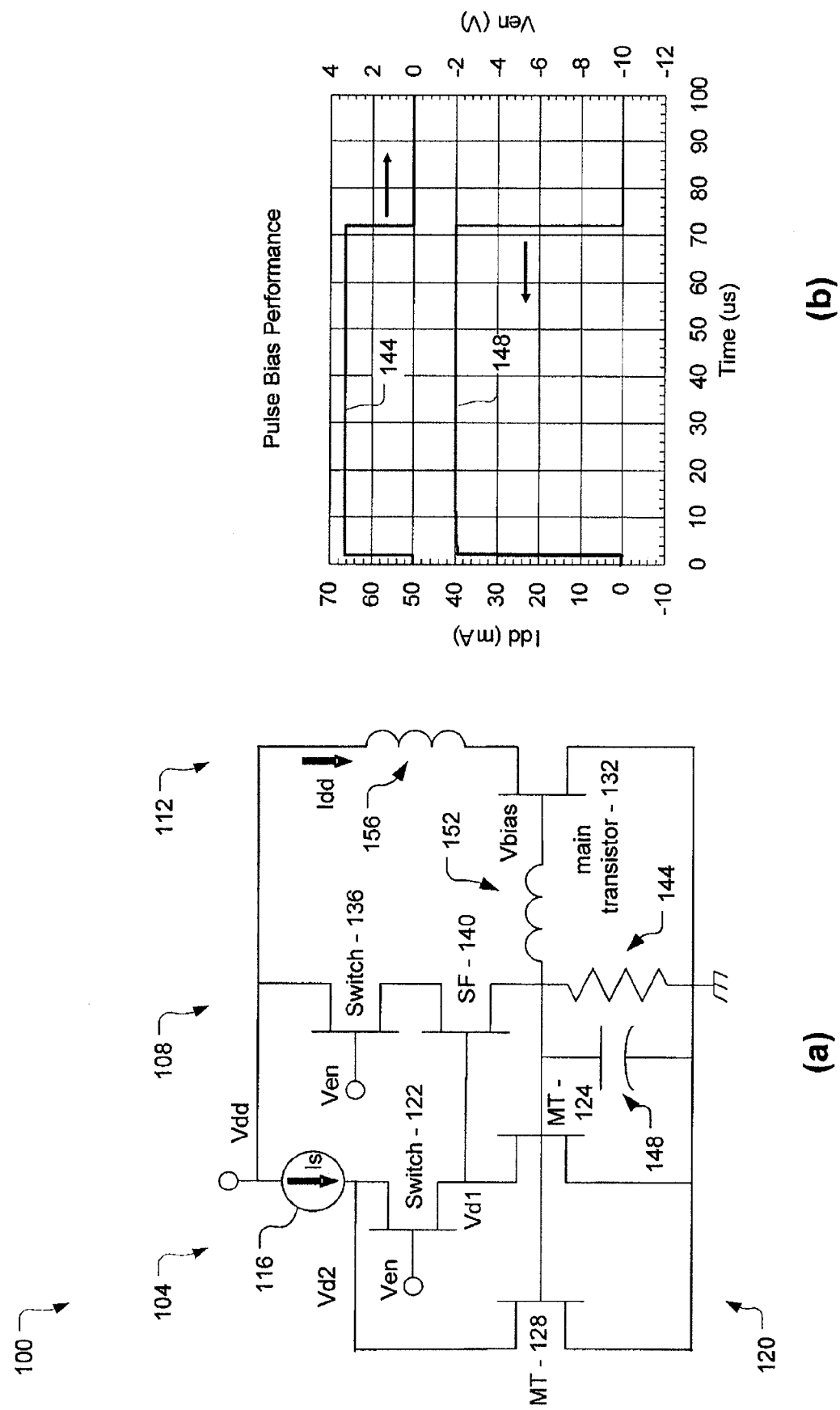
FIGS. 1(a) and 1(b) respectively illustrate a bias network and an associated pulse bias performance in accordance with various embodiments of the present invention.

Various aspects of the illustrative embodiments will be described using terms commonly employed by those skilled in the art to convey the substance of their work to others skilled in the art. However, it will be apparent to those skilled in the art that alternate embodiments may be practiced with only some of the described aspects. For purposes of explanation, specific devices and configurations are set forth in order to provide a thorough understanding of the illustrative embodiments. However, it will be apparent to one skilled in the art that alternate embodiments may be practiced without the specific details. In other instances, well-known features are omitted or simplified in order not to obscure the illustrative embodiments.

Further, various operations will be described as multiple discrete operations, in turn, in a manner that is most helpful in understanding the present invention; however, the order of description should not be construed as to imply that these operations are necessarily order dependent. In particular, these operations need not be performed in the order of presentation.

The phrase "in one embodiment" is used repeatedly. The phrase generally does not refer to the same embodiment; however, it may. The terms "comprising," "having," and "including" are synonymous, unless the context dictates otherwise.

In providing some clarifying context to language that may be used in connection with various embodiments, the phrase "A/B" means (A) or (B); the phrase "A and/or B" means (A), (B), or (A and B); and the phrase "A, B, and/or C" means (A), (B), (C), (A and B), (A and C), (B and C) or (A, B and C).

FIG. 1(a) illustrates a bias network 100 in accordance with various embodiments of the present invention. The bias network 100 may have a supply voltage Vdd applied to a current mirror branch 104, a source follower branch 108, and a main branch 112. The current mirror branch 104 may include a current source Is 116 coupled to a current mirror 120 and an active component switch, e.g., switch transistor 122 (or "switch 122").

An active component, as used herein, may refer to a solid-state device that has gain, directionality, and/or control characteristics as discussed with reference to a particular embodiment. An active component may include, but is not limited to, a transistor.

The current mirror 120 may also include a number of active components, e.g., mirror transistor 124 and mirror transistor 128, that are complementarily configured to stabilize a current associated with the current mirror. The current associated with the current mirror, or mirror current, may correspond to a bias current, Idd, in the main branch 112.

The current source Is 116 may be coupled to a drain of the mirror transistor 128 and to a drain of the switch 122. The arrangement of the mirror transistor 128 and switch 122 may, in this instance, be referred to as a high-side switch arrangement. A source of the switch 122 may be coupled to a drain of the mirror transistor 124. Gates and sources of the mirror transistors 124 and 128 may be commonly coupled to a gate of an active component of the main branch 112, e.g., main transistor 132, and a base voltage, e.g., ground, respectively.

The source follower branch 108 may have another active component switch, e.g., switch transistor 136 (or "switch 136"), and a source follower (SF) active component, e.g., SF transistor 140. The gate of the SF transistor 140 may be coupled to the drain of the mirror transistor 124 and the source of the switch 122. The SF transistor 140 may provide a voltage gain of, e.g., one, to set Vbias to a similar voltage as Vd1 (it may be that Vbias is approximately one pinch-off voltage lower than Vd1). Configured with an active component source follower, the bias network 100 may also be referred to as an active bias network 100. In other embodiments, the source follower component may be a passive device, e.g., resistor or a diode, and the bias network 100 may be referred to as a passive bias network 100.

The switches 122 and 136 may each have a gate configured to admit an enabling voltage Ven to the bias network 100. Any gate current flowing into switch 122 may be smaller than the bias current Idd (e.g., the gate current may be less than 1% of the bias current Idd) in order to avoid a sharp spike in the bias current Idd pulse.

The bias network 100 may also include a number of matching components such as resistor 144, capacitor 148, inductor 152, and inductor 156, coupled to one another and the previously mentioned components as shown.

FIG. 1(b) illustrates a pulse bias performance of the bias network 100 in accordance with various embodiments of the present invention. The enabling voltage Ven, represented by waveform 144, may be admitted to the bias network 100 for a period of time, e.g., 70 microseconds (us). This may also be referred to as the bias network being turned on, or pulsed, for a period of time.

After the bias network 100 is turned on, a current associated with the mirror transistor 128 may quickly rise to an initial value and slowly settle to a target value, e.g., approximately 40 milliamps (mA), over a period of time, e.g., 20-30 us. Over a similar period, a current associated with the mirror transistor 124 may quickly rise to an initial value and slowly ramp up to the target value. This overshoot of the mirror transistor 128 and the slow ramp up of the mirror transistor 124 may combine to provide a substantially flat mirror current and corresponding bias current Idd, represented by waveform 148, over the pulse period. In particular, the complementarily arranged components of the current mirror 120 may stabilize the transient portion of the bias current Idd, e.g., the bias current Idd through the first 30 us of the pulse.

In various embodiments, it may be desirable for the bias current Idd to be set to within a certain percentage, e.g., 1 or 2 percent, of the final current value early in the pulse, e.g., within 2 us. This may facilitate the use of the bias network 100 in an embodiment, e.g., where a demodulator only tracks amplitude at the beginning of a PA pulse.

In some embodiments, an appropriate periphery split ratio of the mirror transistors 124 and 128 may be determined in order to ensure that the overshoot and slow ramp up effectively cancel each other out. The periphery split ratio may be determined by the following equation:

$$Vd*W1=(Vdd-Vd)*W2, \quad \text{EQ. 1}$$

where $Vd \approx Vd1 \approx Vd2$ is the quiescent voltage, Vdd is the supply voltage, and W1 and W2 are the peripheries of the mirror transistors 124 and 128, respectively. Periphery, as used herein, may refer to the size of a given transistor. In particular, and in accordance with an embodiment, periphery may refer to a width of a transistor (as the length and depth may be fixed by the semiconductor process).

While the transistors shown in FIG. 1 illustrate enhancement mode (e-mode) field effect transistors (FETs), other embodiments may additionally/alternatively include bipolar junction transistors (BJT), heterojunction bipolar transistors (HBTs), etc. The transistors may be constructed according to, e.g., pseudomorphic high electron mobility transistor (pHEMT) technology, complementary metal oxide semiconductor (CMOS) technology, etc.

The dispersion in the output conductance resulting in the overshoot and slow ramp up characteristics of the mirror transistors 128 and 124 may be most prevalent in transistors constructed of semiconductor materials from the III-V groups of materials, e.g., gallium arsenide, indium phosphide, etc. However, various embodiments may have transistors constructed of additional/alternative materials.

Figure 2:
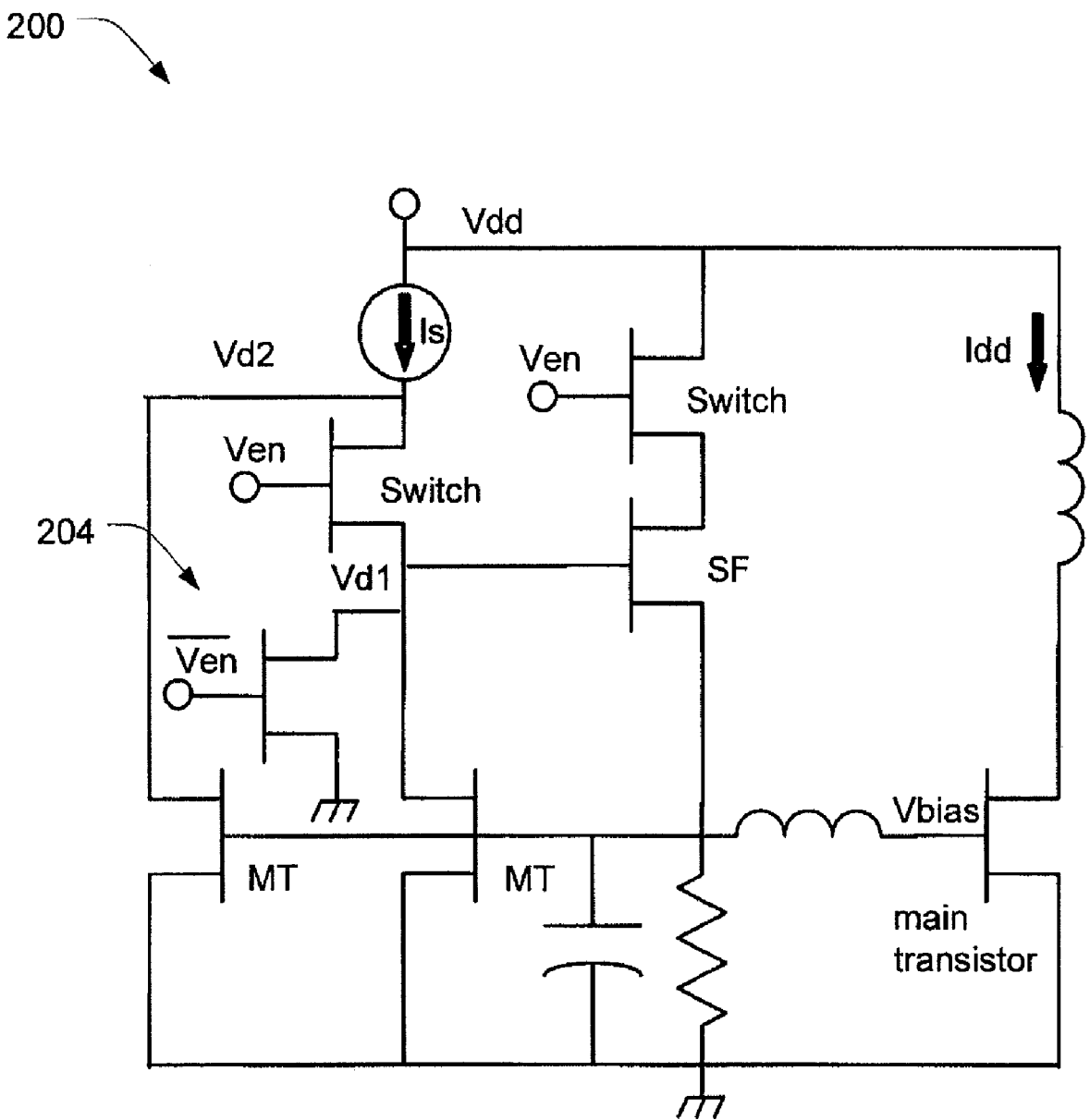
FIG. 2 illustrates another bias network in accordance with various embodiments of the present invention.

FIG. 2 illustrates a bias network 200 in accordance with various embodiments of the present invention. The bias network 200 may be similar to the bias network 100. However, bias network 200 may include a clamp 204. The clamp 204 may be a transistor switch having a gate configured to admit an inverse of the enabling voltage Ven. Thus, when the enabling voltage Ven is not admitted, e.g., at an off-state of the bias network 200, the clamp 204 clamps the Vd1 node to a base voltage, e.g., ground.

Using the clamp 204 as described may prevent the Vd1 node from floating up while the bias network 100 is in an off-state. Without such a clamp, and depending on the leakage current of a particular semiconductor manufacturing process (or "semiconductor process"), the Vd1 node could float up to as much as two times the pinch-off voltage of the MT 124 and SF 140 while the bias network 100 is in the off-state. When the bias network 100 is pulsed on, the Vd1 node would then go from some unknown positive value to Vd1, resulting in EVM degradation.

Figure 3:
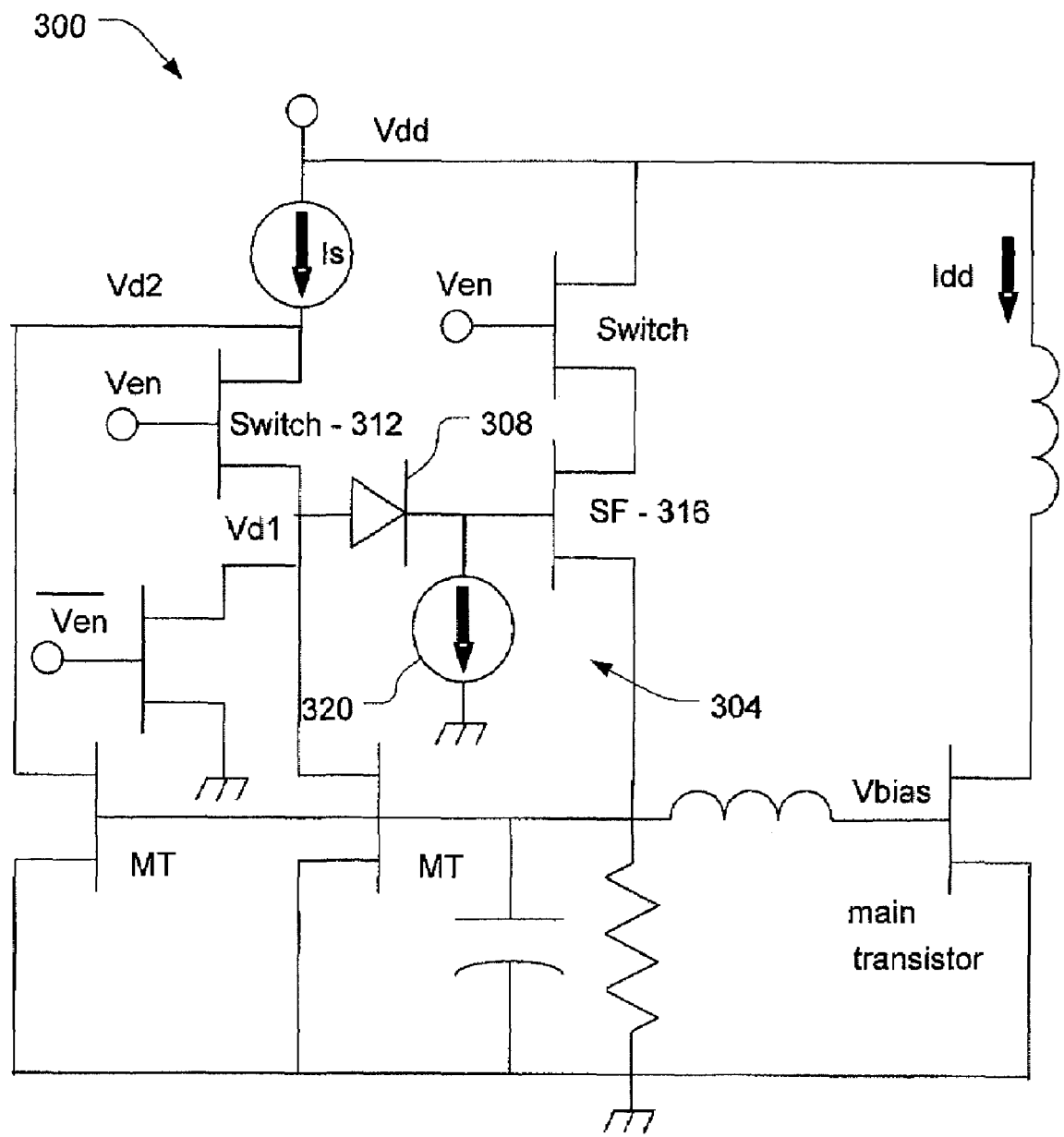
FIG. 3 illustrates another bias network in accordance with various embodiments of the present invention.

FIG. 3 illustrates another bias network 300 in accordance with various embodiments of the present invention. The bias network 300 may be similar to the bias network 200, with the differences described below.

It may be desirable for Vd1 and Vd2 to be close to Vdd to reduce the bias current variation caused by output conductance variation of the mirror transistors. Accordingly, the bias network 300 includes a diode-shift arrangement 304 to move the values of Vd1 and Vd2 closer to Vdd.

The diode-shift arrangement 304 may include a diode 308 coupled between a source of a switch transistor 312 and a gate of an SF transistor 316. The diode 308 may shift the value of Vd1 and Vd2 one diode volt closer to Vdd. In various embodiments, the size, type, and/or number of diodes within the diode-shift arrangement 304 may be adjusted to provide various diode-shift values.

The diode-shift arrangement 304 may also include a pull-down component, e.g., a small current source 320, to pull enough current to ensure that the diode 308 is forward biased. In other embodiments, the pull-down component may be a resistor.

While the clamp introduced and discussed in FIG. 2 and the diode-shift arrangement 304 introduced and discussed in FIG. 3 may not change the bias performance, they may increase the robustness of a bias network over semiconductor process variations. That is, bias networks, so designed, will work well with a variety of components that may exhibit slightly different performance characteristics (e.g., pinch-off voltage, output conductance, leakage current, etc.). The different performance characteristics of the components may be the result of variations within semiconductor processes, e.g., variations from one manufacturing batch to the next.

Figure 4:
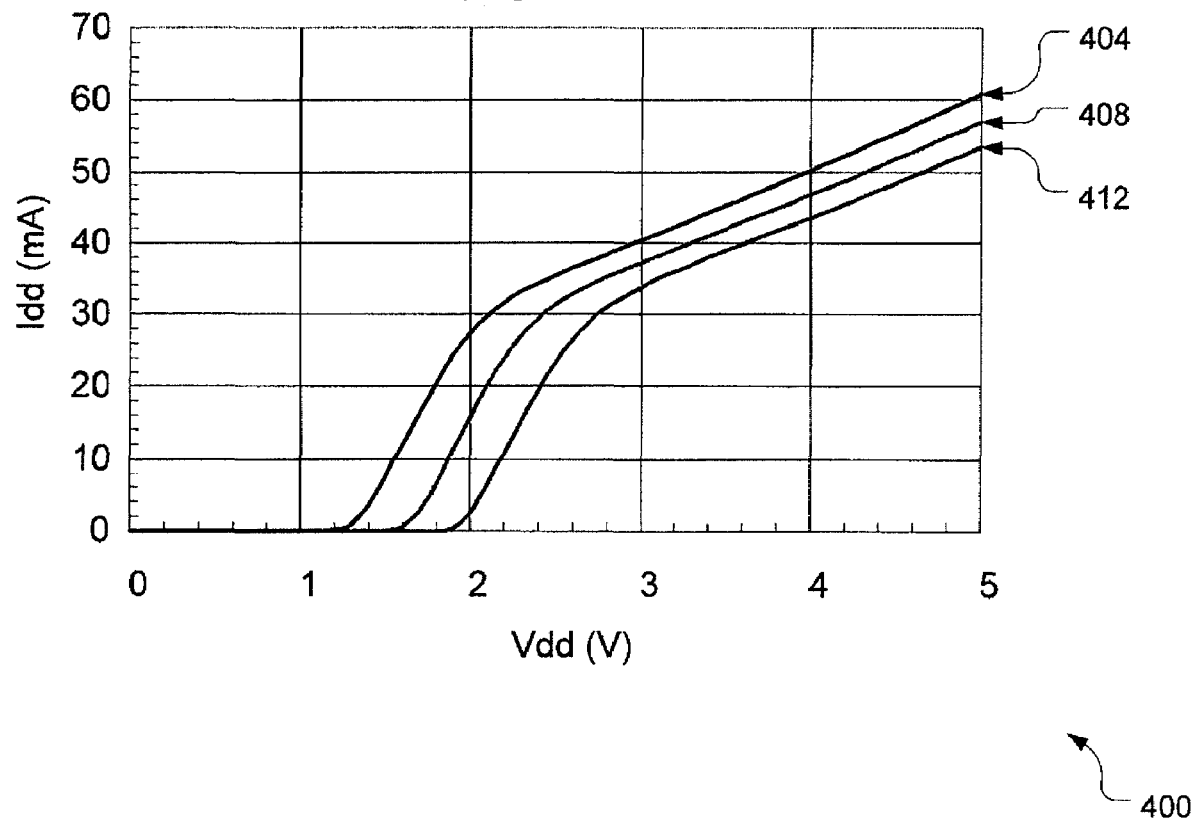
FIG. 4 is a chart depicting quiescent bias performance over supply voltage of a bias network in accordance with various embodiments of the present invention.

FIG. 4 is a chart 400 depicting the quiescent bias performance over supply voltage Vdd of bias networks of various embodiments of the present invention. In particular, the chart 400 depicts performances of bias networks having semiconductor processes with negative pinch-off values, represented by line 404, semiconductor processes with normal pinch-off values, represented by line 408, and semiconductor processes with positive pinch-off values, represented by line 412. As can be seen, the quiescent bias performances of the different semiconductor processes may vary over device pinch-off voltage and supply voltage.

As used herein negative and positive values may be values relative to the normal value. For example, the negative pinch-off value may be 0.1 V, the normal pinch-off value may be 0.3 V, and the positive pinch-off value may be 0.4 V.

For some transistors, e.g., pHEMTs, the pinch-off voltage (e.g., the voltage at which the transistors may turn on and off) may vary over semiconductor process. This may result in a variation on the drain voltage of the mirror transistors, e.g., Vd1 and Vd2, which will then result in a variation on the bias current Idd. Accordingly, various embodiments of the present invention provide a bias network with a compensation circuit to address these effects.

Figure 5:
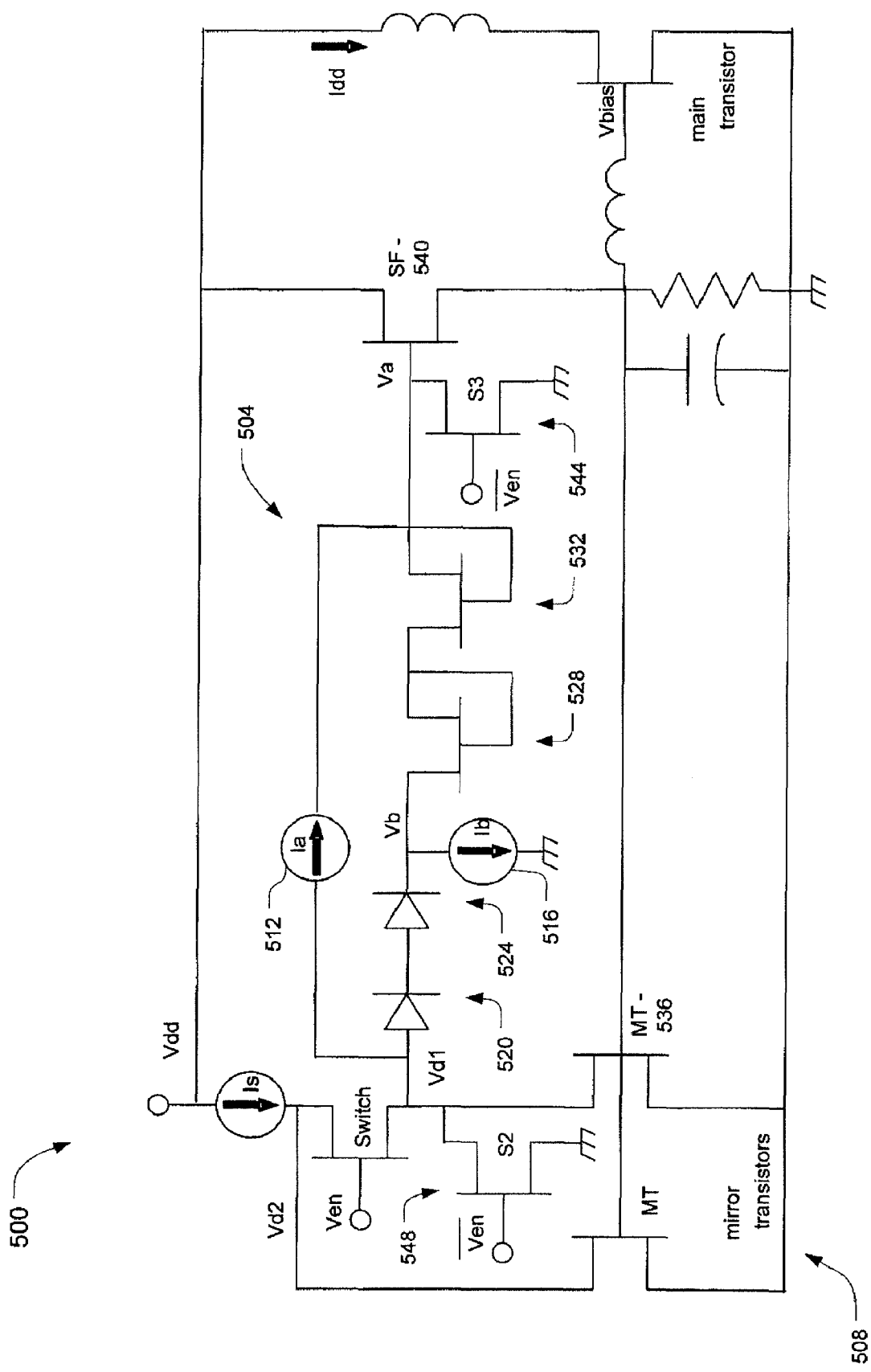
FIG. 5 illustrates a bias network with a compensation circuit in accordance with various embodiments of the present invention.

FIG. 5 illustrates a bias network 500 in accordance with various embodiments of the present invention. The bias network 500 may be similar to other bias networks described above; however, bias network 500 may include a compensation circuit 504 configured to compensate for semiconductor process variation caused by, e.g., pinch-off voltage variation and/or output conductance variation, of the plurality of active components of a current mirror 508.

In some embodiments, this compensation may come as the result of the compensation circuit 504 boosting the drain voltage of the transistors of the current mirror 508 by one or more diode increases, while keeping the voltage substantially constant over the pinch-off voltage.

As shown, the compensation circuit 504 may include two current sources, e.g., current source Ia 512 and current source Ib 516. The current source Ib 516 may act as a pull-down component to forward bias a pair of diodes, e.g., diodes 520 and 524. The current source Ib 516 may have a value high enough to turn on the diodes 520 and 524 and transistors 528 and 532, e.g., ~10 microamps (uA). In some embodiments, the current source Ib 516 may be replaced with a large resistor.

The current source Ia 512 may have a value sufficient to supply transistors 528 and 532, e.g., ~2 uA. The transistors 528 and 532 may be coupled, in series, to the diodes 520 and 524. The transistors 528 and 532 may each be e-mode FET diode-connected transistors.

The two transistors 528 and 532 below the node Va may cause the variation of Va to be twice the pinch-off voltage variation. The voltage variation across the transistors 528 and 532 may also be twice the pinch-off voltage variation. These voltage variations may substantially cancel each other out, resulting in Vd1 and the voltage across the diodes 520 and 524 being fairly constant.

In particular, the diodes 520 and 524 may shift the voltage up by two diode drops and the diode-connected transistors 528 and 532 may shift the voltage down by two EFET pinch offs. Being diode-connected transistors, the transistors 528 and 532 may start to conduct at approximately the pinch-off voltage of a given semiconductor process. Accordingly, any variance in the pinch-off of MT 536 and SF transistor 540 may be compensated by the transistors 528 and 532 to correct Vb. For example, if the pinch off of MT 536 and SF transistor 540 go up, the transistors 528 and 532 may also go up, so the voltage Vb will go down. The diodes 520 and 524 may be substantially constant versus semiconductor process. As a result, the voltage Vd1 may be more constant over varying semiconductor processes.

The compensation circuit 504 may also include a clamp 544, which may be similar to clamp 548, to clamp Va down to ground when the bias network 500 is off. The inclusion of clamps 544 and 548 may depend on the attributes of a particular embodiment and may not be present in all embodiments.

Figure 6:
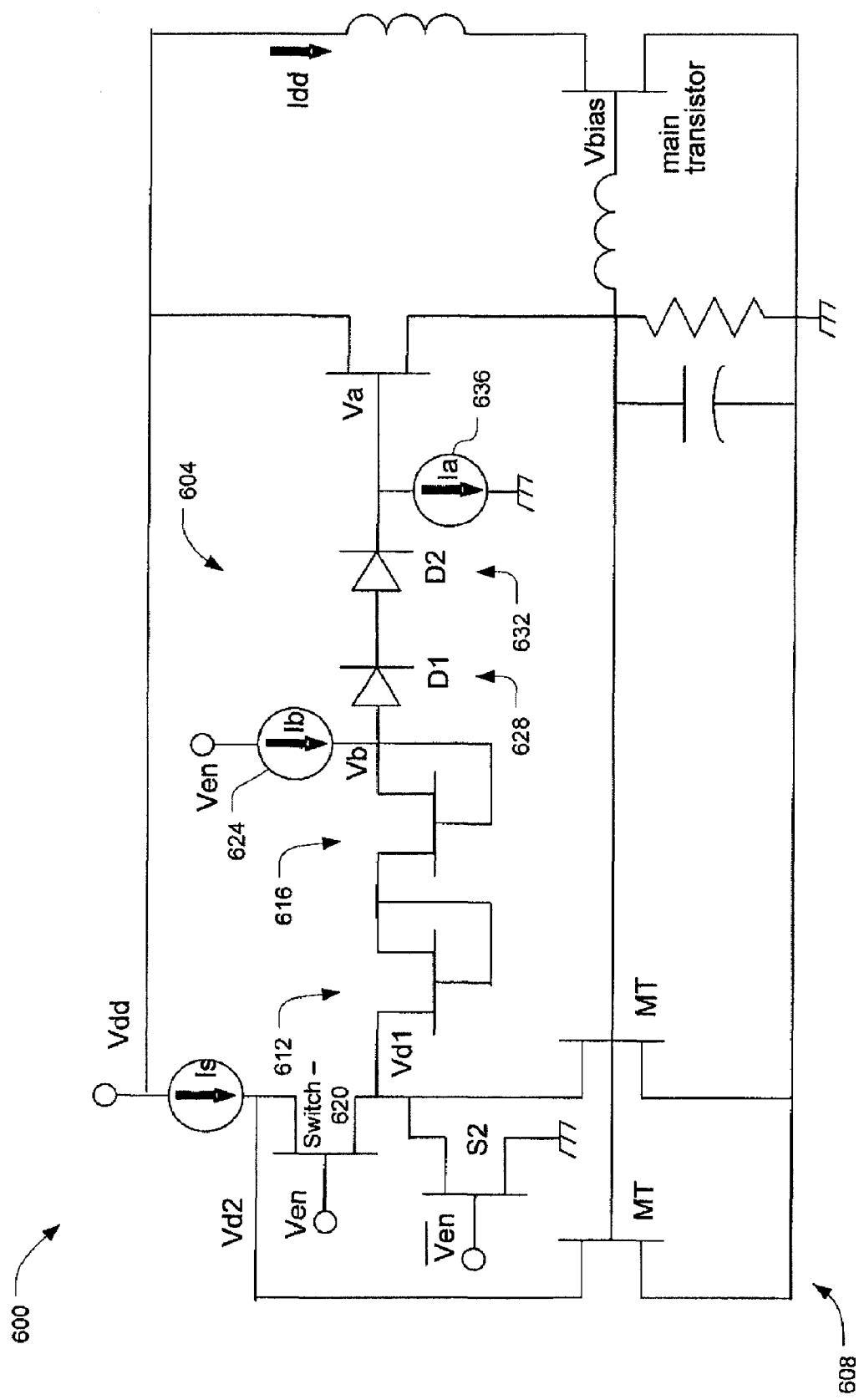
FIG. 6 illustrates a bias network with another compensation circuit in accordance with various embodiments of the present invention.

FIG. 6 illustrates a bias network 600 in accordance with various embodiments of the present invention. Similar to the bias network 500, the bias network 600 may include a compensation circuit 604 configured to compensate for semiconductor process variation of the plurality of active components of a current mirror 608. However, the compensation circuit 604 may differ from the compensation circuit 504 as follows.

The compensation circuit 604 may include a pair of diode-connected transistors, e.g., transistors 612 and 616, coupled to a source of a transistor switch 620. A low-value current source Ib 624 may pull up the transistors 612 and 616.

The compensation circuit 604 may also include a pair of diodes, e.g., diodes 628 and 632, coupled together in series and forward biased by another low-value current source Ia 636. The current source Ia 636 may pull down Va when the bias network 600 is off. Therefore, the compensation circuit 604 may not need a clamp.

In various embodiments, the current sources Ia 636 and/or Ib 624 may be replaced by resistors.

While the compensation circuits shown and described in FIGS. 5 and 6 may not change the pulse bias performance, or the quiescent bias variation over supply voltage, they may reduce the quiescent bias variation over pinch-off voltage.

Figure 7:
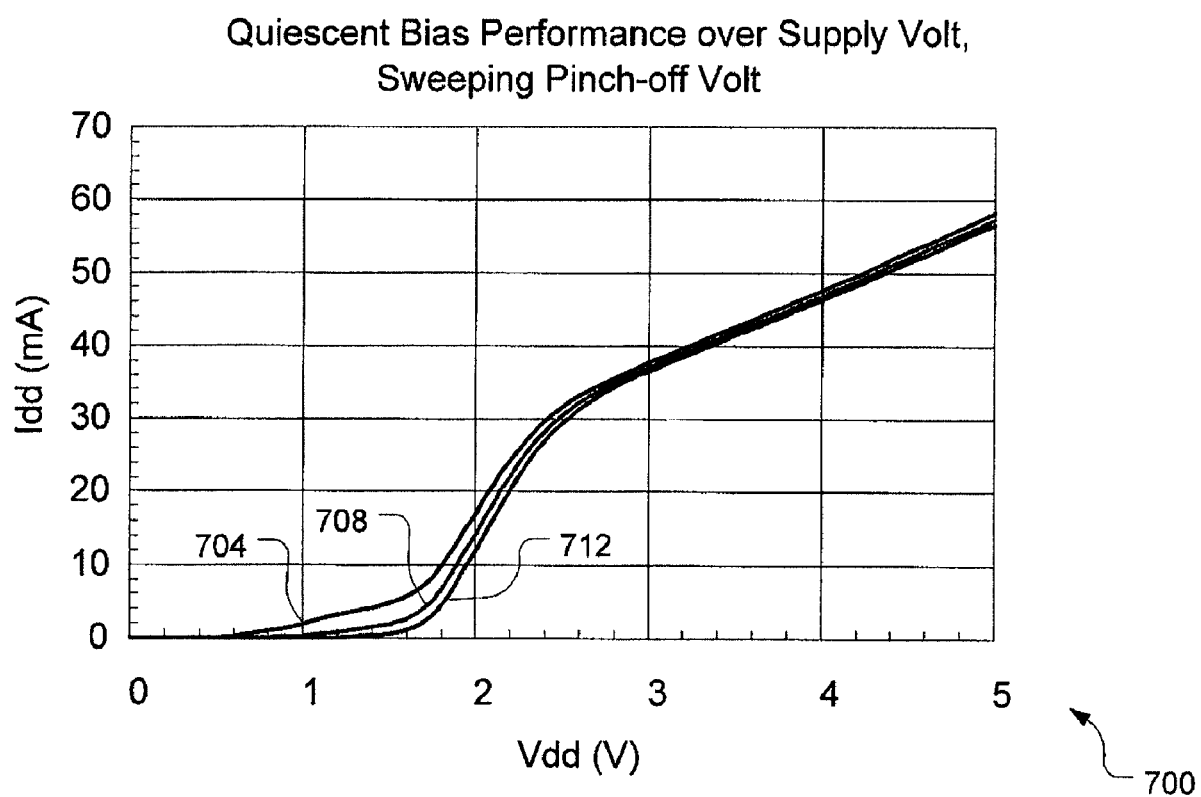
FIG. 7 is a chart depicting quiescent bias performance over supply voltage of a bias network with compensation circuit in accordance with various embodiments of the present invention.

FIG. 7 is a chart 700 depicting the quiescent bias performance over supply voltage Vdd of bias networks with compensation circuits in accordance with various embodiments of the present invention. In particular, the chart 700 depicts performances of bias networks, which include compensation circuits, having semiconductor processes with negative pinch-off values, represented by line 704, semiconductor processes with normal pinch-off values, represented by line 708, and semiconductor processes with positive pinch-off values, represented by line 712. As can be seen by comparison to chart 400, the variation between lines 704, 708, and 712 has been reduced.

Bias networks having compensation circuits as shown may provide a robust arrangement over the pulse and semiconductor process variation. However, the bias current may still vary over supply voltage Vdd (as can be seen from the continually increasing lines 704, 708, and 712). It may be desirable in some embodiments to provide a relatively flat bias current Idd over a typical Vdd operating range of a bias network, e.g., from 3 V to 3.6 V. Accordingly, embodiments of the present invention provide bias networks with a steering circuit configured to compensate for supply voltage variation.

Figure 8:
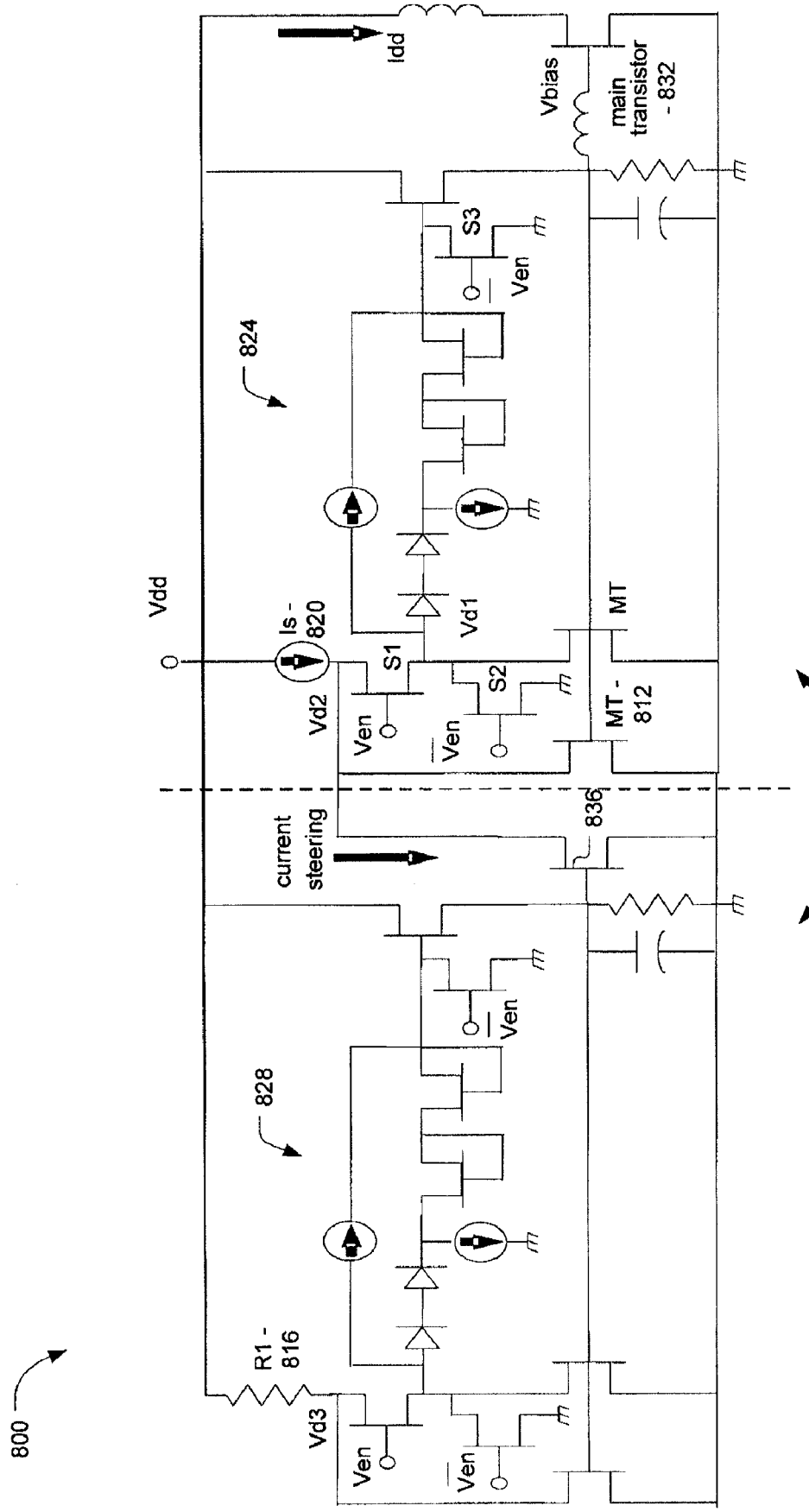
FIG. 8 illustrates a bias network with a steering circuit in accordance with various embodiments of the present invention.

FIG. 8 illustrates a bias network 800 having a steering circuit 804 in accordance with an embodiment of the present invention. The steering circuit 804 may be coupled to a main circuit 808, which may be similar to bias network 500, as shown. In particular, the steering circuit 804 may be coupled to the main circuit 808 at a mirror transistor 812 and at a supply voltage Vdd node.

The steering circuit 804 may have a bias-network structure similar to the main circuit 808; however, the steering circuit 804 may have a resistor R1 816 instead of a current source Is 820. Both the main circuit 808 and the steering circuit 804 include a compensation circuit, e.g., compensation circuits 824 and 828, respectively. In various embodiments, the main circuit 808 and/or the steering circuit 804 may include any combination of bias networks, with or without compensation circuits, disclosed herein. For example, in one embodiment the main circuit 808 may be similar to the bias network 500 while the steering circuit 804 may be similar to the bias network 600, etc.

As the supply voltage Vdd goes up, the bias current Idd may tend to increase due to the positive output conductance of the main transistor 832 (see, e.g., chart 700). In this embodiment, the steering circuit 804 may work to bypass more current from the main current Is as the supply voltage Vdd increases, causing the bias current Idd to decrease. In particular, as Vdd goes up so to will a voltage Vd3. The increased voltage Vd3 may result in a greater current through the main transistor 836 of the steering circuit 804. This steered current will be taken away from Is 820, thereby causing a corresponding decrease in the bias current Idd through the main transistor 832.

In various embodiments, the resistor R1 816 and the transistors of the steering circuit 804 may be sized to provide the desired current steering.

Figure 9:
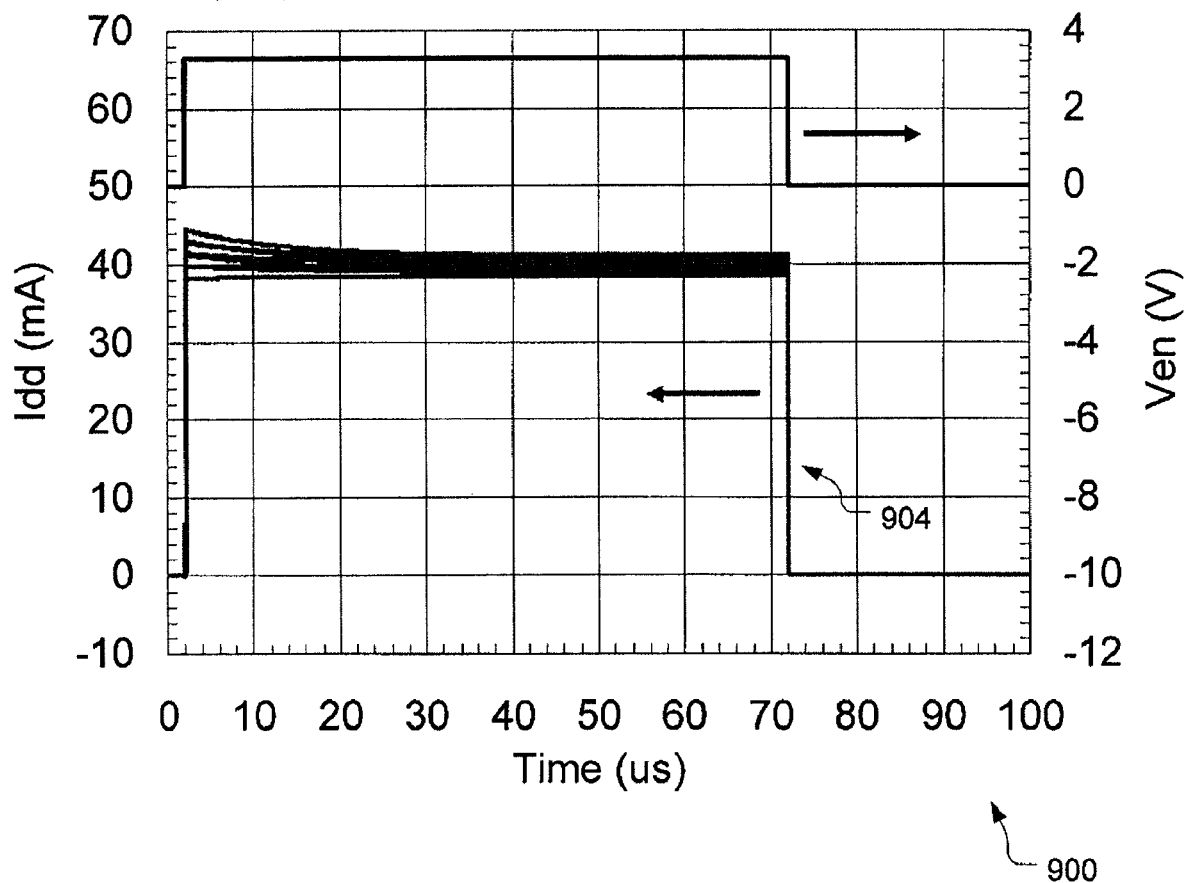
FIG. 9 illustrates a pulse bias performance of a bias network with a compensation circuit and steering circuit in accordance with various embodiments of the present invention.

FIG. 9 is a chart 900 depicting a pulse bias performance of the bias network 800 in accordance with various embodiments of the present invention. The overlaid waveforms 904 illustrate the bias current Idd over various pinch-off voltages (negative, normal, and positive) and supply voltages Vdd (3, 3.3, and 3.6V). As can be seen, the bias current Idd provided by the bias network 800 is relatively stable over both the transient and remaining portion of the pulse.

Figure 10:
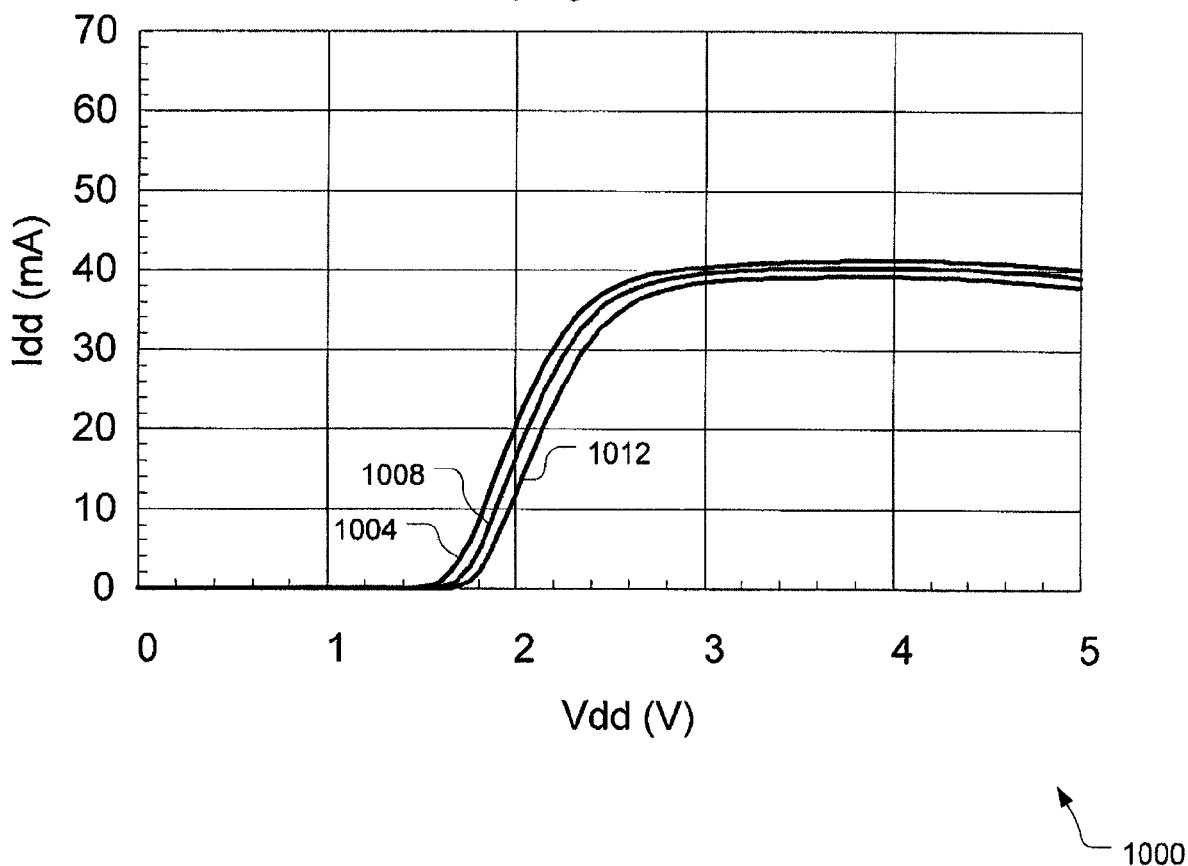
FIG. 10 is a chart depicting quiescent bias performance over supply voltage of bias network with a compensation circuit and steering circuit in accordance with various embodiments of the present invention.

FIG. 10 is a chart 1000 depicting the quiescent bias performance over supply voltage Vdd of bias network 800 in accordance with various embodiments of the present invention. In particular, the chart 1000 depicts the bias network 800 having semiconductor processes with negative pinch-off voltages, represented by line 1004, semiconductor processes with normal pinch-off values, represented by line 1008, and semiconductor processes with positive pinch-off values, represented by line 1012. As can be seen by comparison to chart 700, the variation of bias current Idd over operating ranges of the supply voltage Vdd has been reduced.

Bias networks providing a stable bias current over a pulse have been shown and described herein in accordance with various embodiments. These bias networks may be utilized in a variety of applications including, but not limited to, wireless transceivers for transmitting RF signals over communication links in various networks.

Figure 11:
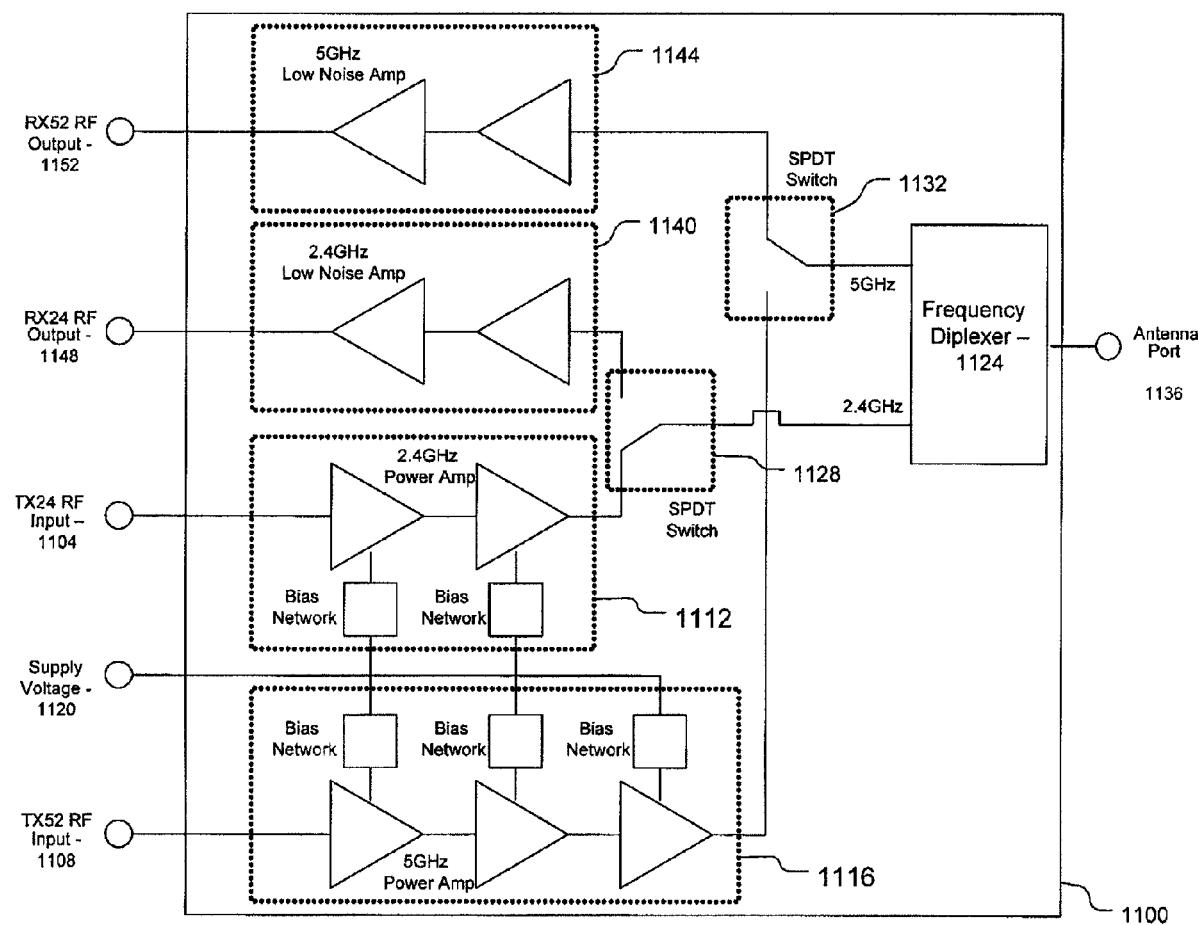
FIG. 11 is a wireless transceiver front end module in accordance with various embodiments of the present invention.

FIG. 11 illustrates a wireless transceiver front end module 1100 in accordance with various embodiments of the present invention. The front end module 1100, which may be used in a WLAN, may be a dual-band front end having first and second transmitter inputs, e.g., TX24 RF input 1104 and TX52 RF input 1108. The TX24 RF input 1104 may be coupled to a 2.4 gigahertz (GHz) power amplifier 1112 while the TX52 RF input 1108 may be coupled to a 5 GHz power amplifier 1116. A supply voltage input 1120 may also be coupled to the 2.4 GHz power amplifier 1112 and the 5 GHz power amplifier 1116.

The power amplifiers 1112 and/or 1116 may include a number of bias network-operational amplifier pairs. One or more of the bias networks of the power amplifiers may be a bias network with a stable transient response as taught by embodiments of the present invention. Power amplifiers, so equipped, may provide a steady RF gain that may result in a relatively low EVM throughout dynamic operation of the front end module 1100.

The power amplifiers 1112 and 1116 may be coupled to a frequency diplexer 1124 through single pole, double throw (SPDT) switches 1128 and 1132, respectively. The frequency diplexer 1124 may be coupled to an antenna port 1136.

The SPDT switches 1128 and 1132 may also be coupled to a 2.4 GHz low noise amplifier 1140 and a 5 GHz low noise amplifier 1144, respectively. The low noise amplifiers 1140 and 1144 may, in turn, be coupled to RX 24 RF output 1148 and RX52 RF output 1152, respectively.

Although the present invention has been described in terms of the above-illustrated embodiments, it will be appreciated by those of ordinary skill in the art that a wide variety of alternate and/or equivalent implementations calculated to achieve the same purposes may be substituted for the specific embodiments shown and described without departing from the scope of the present invention. Those with skill in the art will readily appreciate that the present invention may be implemented in a very wide variety of embodiments. This description is intended to be regarded as illustrative instead of restrictive on embodiments of the present invention.

What is claimed is:

1. A bias network comprising:
   an active component having a bias current;
   a switch to admit an enabling voltage to the bias network; and
   a current mirror coupled to the switch and the active component and having a mirror current that corresponds to the bias current, the current mirror including a plurality of active components complementarily configured to stabilize the mirror current.

2. The bias network of claim 1, wherein the switch comprises a switch transistor with a gate, a source, and a drain; and the current mirror comprises a first mirror transistor of the plurality of active components having a drain coupled to the drain of the switch transistor, and a second mirror transistor of the plurality of active components having a drain coupled to the source of the switch transistor.

3. The bias network of claim 1, further comprising:
   a clamp coupled to the switch to clamp a first voltage to ground when the enabling voltage is not admitted to the bias network.

4. The bias network of claim 1, further comprising:
   a diode coupled to the switch to shift a first voltage closer to a bias voltage when the enabling voltage is admitted to the bias network.

5. The bias network of claim 4, further comprising:
   a clamp coupled to the switch to clamp the first voltage to ground when the enabling voltage is not admitted to the bias network.

6. The bias network of claim 4, further comprising:
   a source follower transistor having a gate coupled to the diode.

7. The bias network of claim 4, further comprising:
   a biasing component coupled to the diode and configured to forward bias the diode.

8. The bias network of claim 1, further comprising:
   a compensation circuit coupled to the current mirror and configured to compensate for semiconductor process variation of the plurality of active components.

9. The bias network of claim 8, further comprising:
   a source follower transistor having a gate coupled to the compensation circuit; and
   the compensation circuit including one or more diodes, and one or more diode-connected transistors coupled to the one or more diodes.

10. The bias network of claim 9, wherein the compensation circuit further comprises:
    a first diode of the one or more diodes coupled to the current mirror;
    a second diode of the one or more diodes coupled, in series, with the first diode;
    a first diode-connected transistor of the one or more diode-connected transistors coupled, in series, with the second diode; and
    a second diode-connected transistor of the one or more diode-connected transistors coupled, in series, with the second diode and the gate of the source follower transistor.

11. The bias network of claim 10, wherein the compensation circuit further comprises:
    a current source to supply current to the one or more diode-connected transistors.

12. The bias network of claim 9, wherein the compensation circuit further comprises:
    a first diode-connected transistor of the one or more diode-connected transistors coupled to the current mirror;

a second diode-connected transistor of the one or more diode-connected transistors coupled, in series, with the first diode-connected transistor;

a first diode of the one or more diodes coupled, in series, with the second diode-connected transistor; and a second diode of the one or more diodes coupled, in series, with the first diode and the gate of the source follower transistor.

13. The bias network of claim 12, wherein the compensation circuit further comprises:

a pull-up current source coupled to the second diode-connected transistor and the first diode.

14. The bias network of claim 9, further comprising:

a steering circuit coupled to the current mirror and configured to compensate for a variation in supply voltage of the bias network.

15. A method comprising:

admitting an enabling voltage to a bias network; and stabilizing a mirror current that corresponds to a bias current of the bias network through a plurality of complementarily arranged active components of a current mirror.

16. The method of claim 15, wherein said stabilizing the mirror current comprises coupling a first current through a first active component of the plurality of active components with a second current through a second active component of the plurality of active components.

17. The method of claim 15, further comprising:

compensating, with a compensation circuit coupled to the current mirror, for semiconductor process variation of the plurality of active components.

18. The method of claim 15, further comprising:

compensating, with a steering circuit, for a variation in supply voltage of the bias network.

19. A system comprising:

a bias network including an active component having a bias current;

a switch to admit an enabling voltage to the bias network; and a current mirror having a mirror current that corresponds to the bias current, the current mirror including a plurality of active components complementarily configured to stabilize the mirror current; and an operational amplifier coupled to the bias network to receive the bias current and configured to receive one or more input signals and to output an amplified signal based at least in part on the one or more input signals.

20. The system of claim 19, wherein the switch comprises a switch transistor with a gate, a source, and a drain; and the current mirror comprises a first mirror transistor of the plurality of active components having a drain coupled to the drain of the switch transistor; and a second mirror transistor of the plurality of active components having a drain coupled to the source of the switch transistor.

21. The system of claim 19, further comprising:

a clamp coupled to the switch to clamp a first voltage to ground when the enabling voltage is not admitted to the bias network.

22. The system of claim 19, wherein the bias network further comprises:

a compensation circuit coupled to the current mirror and configured to compensate for semiconductor process variation of the plurality of active components.

23. The system of claim 22, wherein the bias network further comprises:

a source follower transistor having a gate coupled to the compensation circuit;

the compensation circuit includes one or more diodes, and one or more diode-connected transistors coupled to the one or more diodes.

24. The system of claim 23, wherein the compensation circuit comprises:

a first diode of the one or more diodes coupled to the current mirror;

a second diode of the one or more diodes coupled, in series, with the first diode;

a first diode-connected transistor of the one or more diode-connected transistors coupled, in series, with the second diode; and a second diode-connected transistor of the one or more diode-connected transistors coupled, in series, with the second diode and the gate of the source follower transistor.

25. The system of claim 23, wherein the bias network further comprises:

a steering circuit coupled to the current mirror and configured to compensate for a variation in supply voltage of the bias network.

26. The system of claim 19, wherein the system is a power amplifier.

* * * * *